(12) United States Patent
Chen

(10) Patent No.: US 8,581,360 B2
(45) Date of Patent: Nov. 12, 2013

(54) TRENCH SCHOTTKY DIODE AND MANUFACTURING METHOD THEREOF

(76) Inventor: Tzu-Hsiung Chen, Taipei (TW)

( * ) Notice: Subject to any disclaimer, the term of this patent is extended or adjusted under 35 U.S.C. 154(b) by 0 days.

(21) Appl. No.: 13/396,863

(22) Filed: Feb. 15, 2012

(65) Prior Publication Data

US 2012/0205772 A1    Aug. 16, 2012

(30) Foreign Application Priority Data

Feb. 15, 2011   (TW) .............................. 100104981 A

(51) Int. Cl.
   *H01L 21/329*    (2006.01)

(52) U.S. Cl.
   USPC .......................................... 257/471; 438/570

(58) Field of Classification Search
   USPC ............ 257/471, E21.359, E29.338; 438/570
   See application file for complete search history.

(56) References Cited

U.S. PATENT DOCUMENTS

| | | | | |
|---|---|---|---|---|
| 5,365,102 A | * | 11/1994 | Mehrotra et al. | 257/475 |
| 7,276,771 B2 | * | 10/2007 | Fujihira et al. | 257/471 |
| 7,816,732 B2 | * | 10/2010 | Hsieh | 257/334 |
| 8,426,913 B2 | * | 4/2013 | Hsieh | 257/334 |
| 2009/0315106 A1 | * | 12/2009 | Hsieh | 257/334 |

* cited by examiner

*Primary Examiner* — Thao P. Le
(74) *Attorney, Agent, or Firm* — WPAT, PC; Justin King

(57) ABSTRACT

A trench Schottky diode and a manufacturing method thereof are provided. A plurality of trenches are formed in A semiconductor substrate. A plurality of doped regions are formed in the semiconductor substrate and under some of the trenches. A gate oxide layer is formed on a surface of the semiconductor substrate and the surfaces of the trenches. A polysilicon structure is formed on the gate oxide layer. Then, the polysilicon structure is etched, so that the gate oxide layer within the trenches is covered by the polysilicon structure. Then, a mask layer is formed to cover the polysilicon structure within a part of the trenches and a part of the gate oxide layer, and the semiconductor substrate uncovered by the mask layer is exposed. Afterwards, a metal sputtering layer is formed to cover a part of the surface of the semiconductor substrate.

24 Claims, 15 Drawing Sheets

TRENCH SCHOTTKY DIODE AND MANUFACTURING METHOD THEREOF

This application claims the benefit of Taiwan Patent Application No. 100104981, filed Feb. 15, 2011, the subject matter of which is incorporated herein by reference.

FIELD OF THE INVENTION

The present invention relates to a trench Schottky diode, and more particularly to a trench Schottky diode with low reverse-biased leakage current, low forward voltage drop, high reverse voltage, and fast reverse recovery time. The present invention also relates to a method for manufacturing such a trench Schottky diode.

BACKGROUND OF THE INVENTION

A Schottky diode is a unipolar device using electrons as carriers, which is characterized by high switching speed and low forward voltage drop. The limitations of Schottky diodes are the relatively low reverse voltage tolerance and the relatively high reverse leakage current. The limitations are related to the Schottky barrier height determined by the metal work function of the metal electrode, and the band gap of the semiconductor, the type and concentration of dopants in the semiconductor layer, and other factors. Recently, a trench-MOS Schottky barrier diode has been disclosed. In the trench-MOS Schottky barrier diode, a trench filled with polysilicon or metallic material is used for pinching the reverse-biased leakage current and thus largely reducing the leakage current of the semiconductor device.

A trench-MOS Schottky barrier diode has been disclosed in U.S. Pat. No. 5,365,102, which is entitled "SCHOTTKY BARRIER RECTIFIER WITH MOS TRENCH". Please refer to FIGS. 1A~1F, which schematically illustrate a method of manufacturing a conventional trench MOS Schottky barrier diode.

Firstly, as shown in FIG. 1A, a semiconductor substrate 12 with an epitaxial layer thickness is provided. The substrate 12 has two surfaces 12a and 12b. A heavily-doped (N+ type) cathode region 12c is adjacent to the surface 12a. A lightly-doped (N type) drift region 12d is extended from the heavily-doped (N+ type) cathode region 12c to the surface 12b. A silicon dioxide ($SiO_2$) layer 13 is grown on the substrate 12. A silicon nitride ($Si_3N_4$) layer 15 is grown on the silicon dioxide layer 13. The formation of the silicon dioxide layer 13 may reduce the stress that is provided by the silicon nitride layer 15. Moreover, a photoresist layer 17 is formed on the silicon nitride layer 15.

Then, as shown in FIG. 1B, a photolithography and etching process is performed to pattern the photoresist layer 17 and partially remove the silicon nitride layer 15, the silicon dioxide layer 13 and the substrate 12. Consequently, a plurality of discrete mesas 14 are defined in the drift region 12d of the substrate 12. In addition, the etching step defines a plurality of trenches 22. Each trench 22 has a specified depth and a specified width. Then, as shown in FIG. 1O, a thermal oxide layer 16 is formed on a sidewall 22a and a bottom 22b of the trench 22. Then, as shown in FIG. 1D, the remaining silicon nitride layer 15 and the remaining silicon dioxide layer 13 are removed. Then, as shown in FIG. 1E, a metallization layer 23 is formed over the resulting structure of FIG. 1D. Then, as shown in FIG. 1F, a metallization process is performed to form another metallization layer (not shown) on the backside surface 12a. After a sintering process is performed, the metallization layer 23 contacted with the discrete mesas 14 are connected with each other to define a single anode electrode layer 23, and a cathode electrode 20 on the backside surface 12a, and a cathode electrode layer 20 is formed on the backside surface 12a. Since the anode electrode layer 23 is contacted with the mesas 14, a so-called Schottky barrier results in a Schottky contact. Meanwhile, the trench MOS Schottky barrier diode is produced.

The trench MOS Schottky barrier rectifier (TMBR) fabricated by the above method has low forward voltage drop. Moreover, since the reverse-biased leakage current is pinched by the trench, the leakage current is reduced when compared with the Schottky diode having no trenches. Generally, for the trench MOS Schottky barrier rectifier to be with a reverse voltage of about 120V, its leakage current of is about several tens of microamps. In practice, the magnitude of the leakage current is also dependent on the chip size. Therefore, the present invention relates to a trench Schottky diode with high reverse voltage and low leakage current.

SUMMARY OF THE INVENTION

The present invention provides a trench Schottky diode with high reverse voltage and low leakage current.

An embodiment of the present invention provides a method for manufacturing a trench Schottky diode. Firstly, a semiconductor substrate is provided. Then, a plurality of first trenches and a plurality of second trenches are formed in the semiconductor substrate, wherein the opening width of the first trench is greater than the opening width of the second trench. Then, a plurality of doped regions are formed in the semiconductor substrate and under respective first trenches. A gate oxide layer is formed on a surface of the semiconductor substrate and surfaces of the first trenches and the second trenches. A polysilicon structure is formed on the gate oxide layer. Then, the polysilicon structure is etched, so that the gate oxide layer within the first trenches and the second trenches is covered by the polysilicon structure. Then, a mask layer is formed to cover the polysilicon structure within the first trenches and the gate oxide layer within the first trenches. Then, the semiconductor substrate is etched, so that the surface of the semiconductor substrate uncovered by the mask layer is exposed. Afterwards, a metal sputtering layer is formed to cover a part of the surface of the semiconductor substrate, the polysilicon structure within the second trenches and a part of the mask layer.

Another embodiment of the present invention provides a trench Schottky diode. The trench Schottky diode includes a semiconductor substrate, a plurality of doped regions, a gate oxide layer, a plurality of polysilicon structures, a mask layer and a metal sputtering layer. The semiconductor substrate has a plurality of first trenches and a plurality of second trenches, wherein the opening width of the first trench is greater than the opening width of the second trench. The doped regions are formed in the semiconductor substrate and under respective first trenches. The gate oxide layer is formed on sidewalls and bottom surfaces of the first trenches and the second trenches and formed on a part of a surface of the semiconductor substrate. The polysilicon structures are formed on the gate oxide layer within the first trenches and the second trenches. The mask layer is formed on the polysilicon structures within the first trenches and the gate oxide layer. The metal sputtering layer covers a part of the surface of the semiconductor substrate, the polysilicon structures within the second trenches and a part of the mask layer.

A further embodiment of the present invention provides a method for manufacturing a trench Schottky diode. Firstly, a semiconductor substrate is provided. Then, a first oxide layer is formed on a surface of the semiconductor substrate. The first oxide layer is etched to form a first mask layer. At least one first trench and a plurality of second trenches are formed in the semiconductor substrate, wherein the opening width of the first trench is greater than the opening width of the second trench. A second oxide layer is formed on sidewalls and bottom surfaces of the first trench and the second trenches. The second oxide layer is removed. A third oxide layer is formed on the sidewalls and the bottom surfaces of the first trench and the second trenches. A polysilicon structure is formed to cover the third oxide layer and the first oxide layer. The polysilicon structure is etched, so that the third oxide layer within the second trenches and the sidewall of the first trench are covered by the polysilicon structure. The third oxide layer is etched, so that the third oxide layer within the first trench is thinned or eliminated. An ion implantation process and a drive-in process are performed to form a doped region under the first trenches. A second mask layer is formed to cover a part of the first oxide layer, a part of the polysilicon structure and the first trench. The semiconductor substrate is etched, so that the surface of the semiconductor substrate uncovered by the second mask layer is exposed. Afterwards, a metal sputtering layer is formed to cover a part of the surface of the semiconductor substrate, the polysilicon structure within the second trenches and a part of the second mask layer.

A still embodiment of the present invention provides a trench Schottky diode. The trench Schottky diode includes a semiconductor substrate, a doped region, an oxide layer, a plurality of polysilicon structures, a mask layer and a metal sputtering layer. The semiconductor substrate has at least one first trench and a plurality of second trenches, wherein the opening width of the first trench is greater than the opening width of the second trench. The doped region is formed in the semiconductor substrate and under the first trench. The oxide layer is formed on sidewalls and bottom surfaces of the second trenches, formed on a sidewall and a part of a bottom surface of the first trench, and formed on a part of a surface of the semiconductor substrate. The polysilicon structures are formed on the oxide layer within the second trenches and formed on the oxide layer within the first trench. The mask layer is formed on the polysilicon structures within the first trench and a part of the oxide layer. The metal sputtering layer covers a part of the surface of the semiconductor substrate, the polysilicon structures within the second trenches and a part of the mask layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
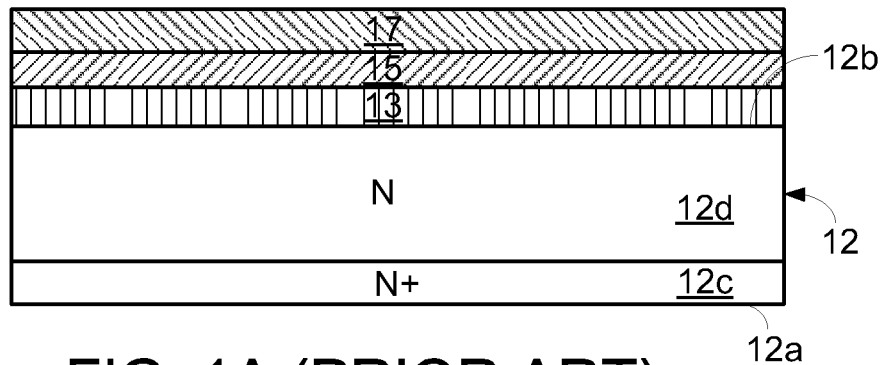
FIGS. 1A~1F (Prior art) illustrate a method of manufacturing a conventional trench MOS Schottky barrier diode.
Figure 1B:
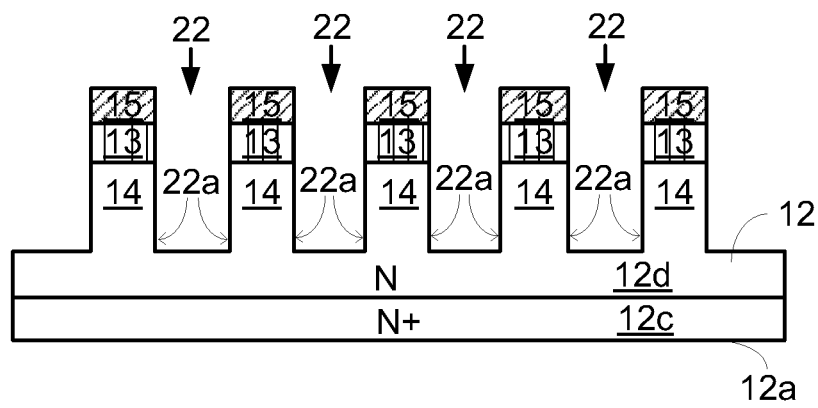
Figure 1C:
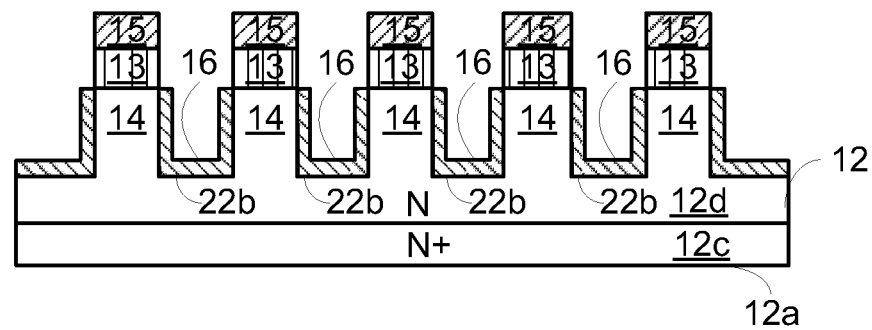
Figure 1D:
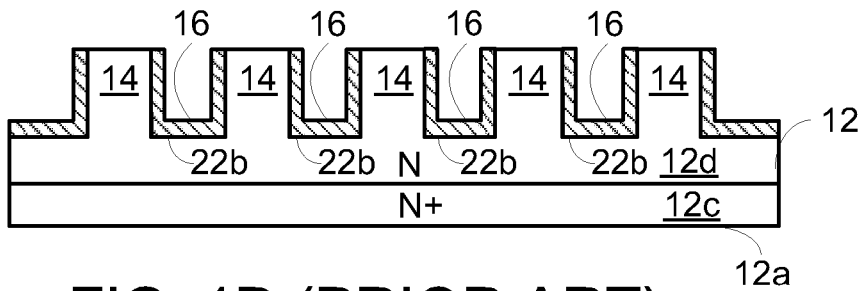
Figure 1E:
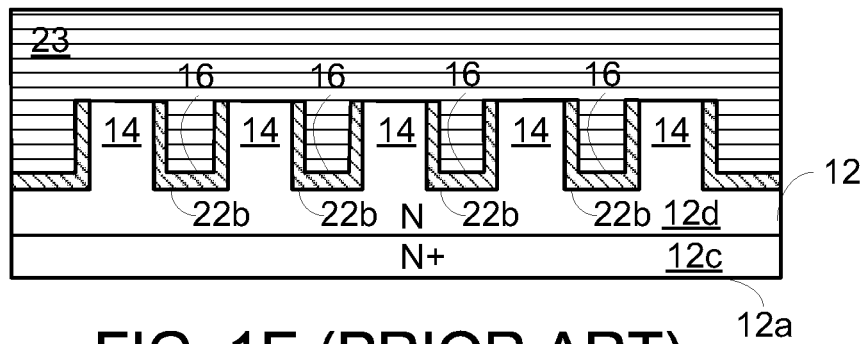
Figure 1F:
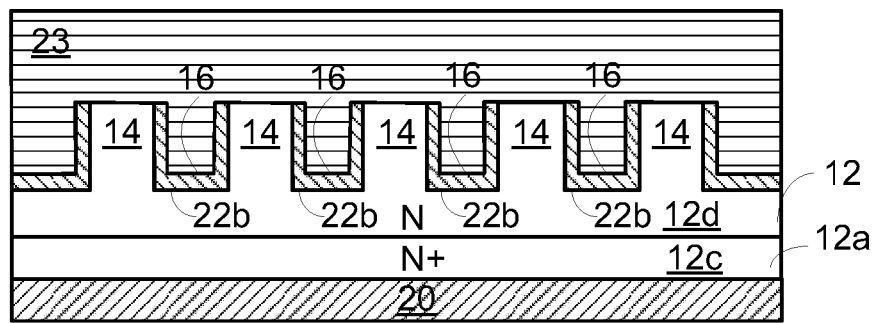
Figure 2A:
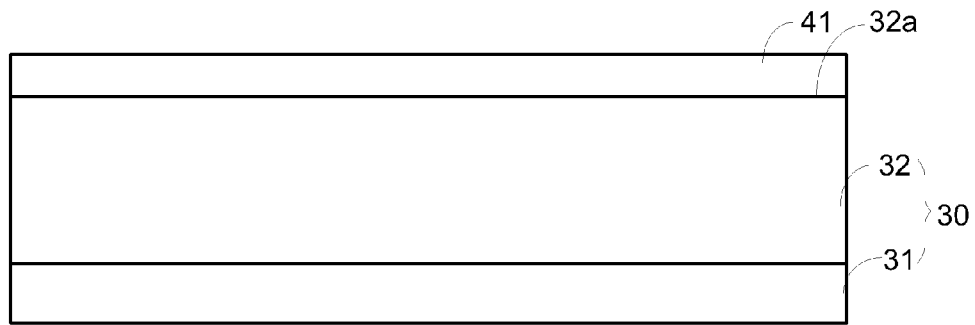
FIGS. 2A~2T schematically illustrate a method of manufacturing a trench Schottky diode according to a first embodiment of the present invention.
Figure 2B:
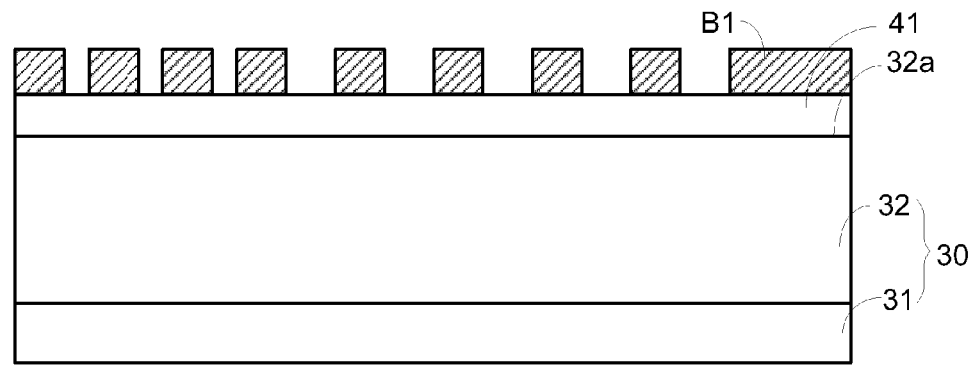
Figure 2C:
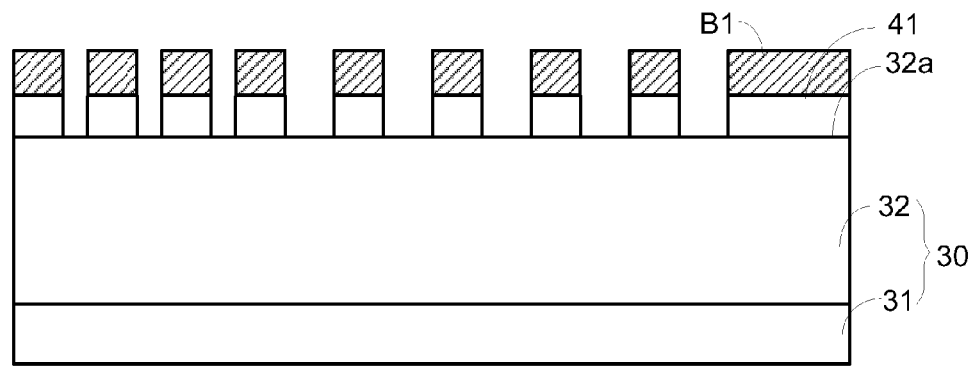
Figure 2D:
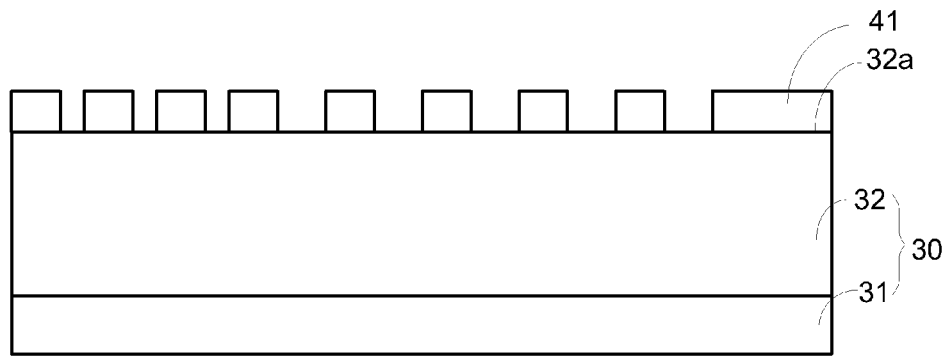
Figure 2E:
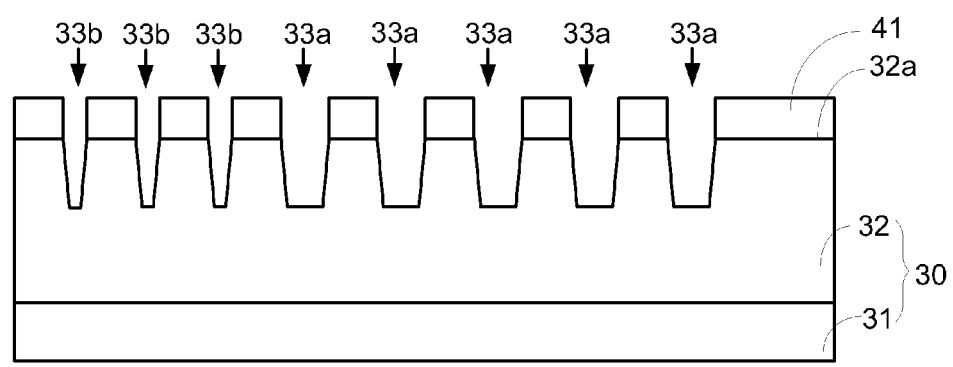
Figure 2F:
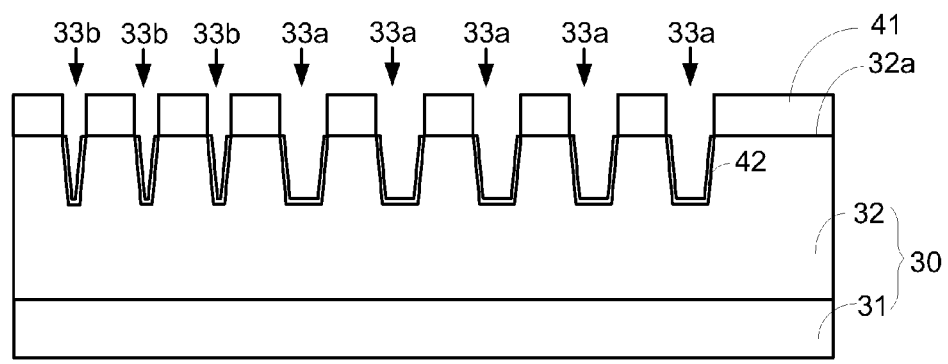
Figure 2G:
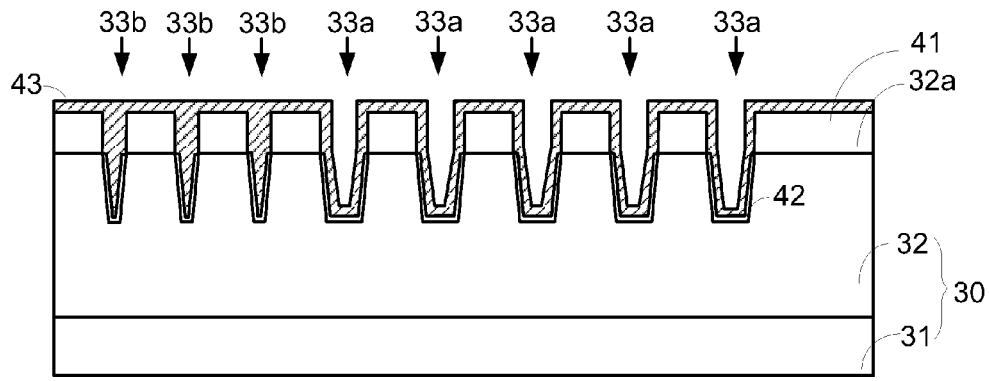
Figure 2H:
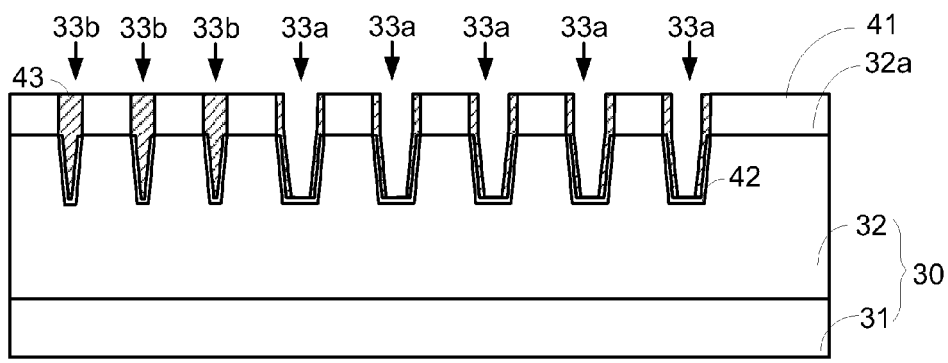
Figure 2I:
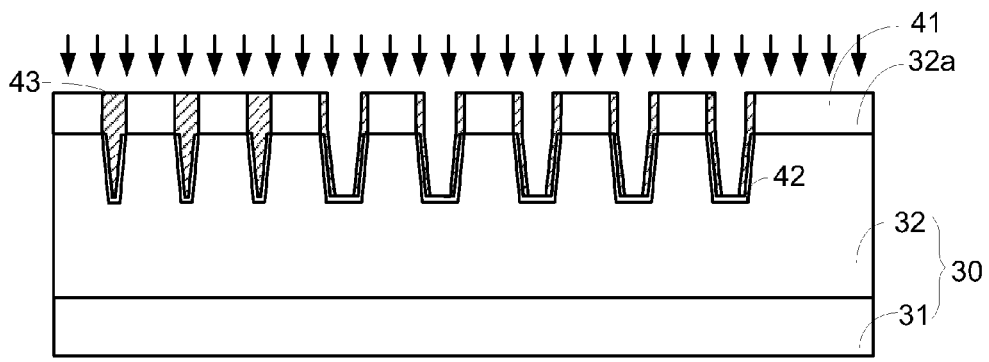
Figure 2J:
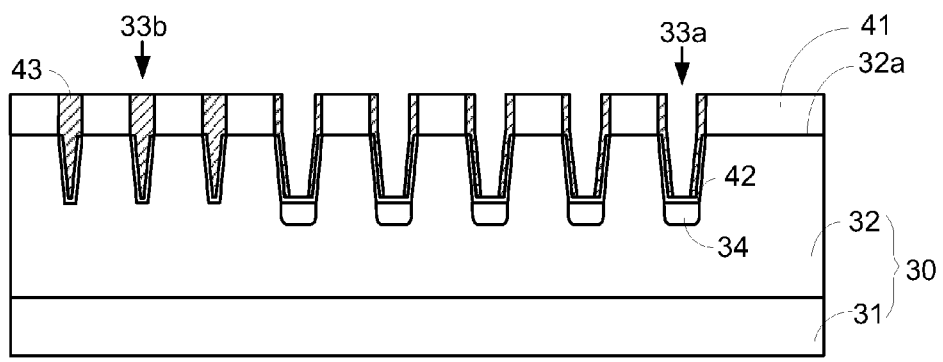
Figure 2K:
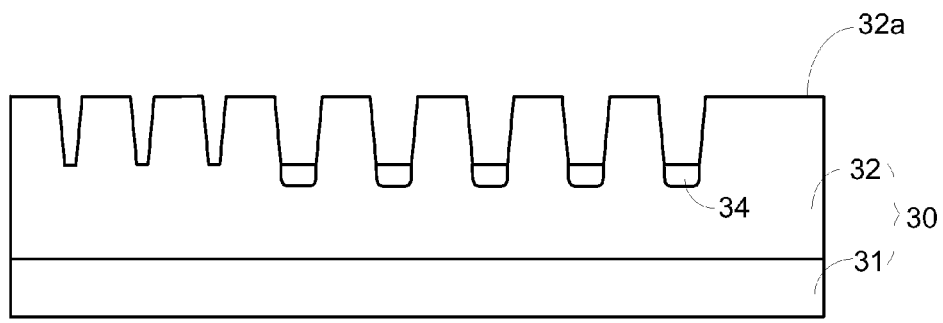
Figure 2L:
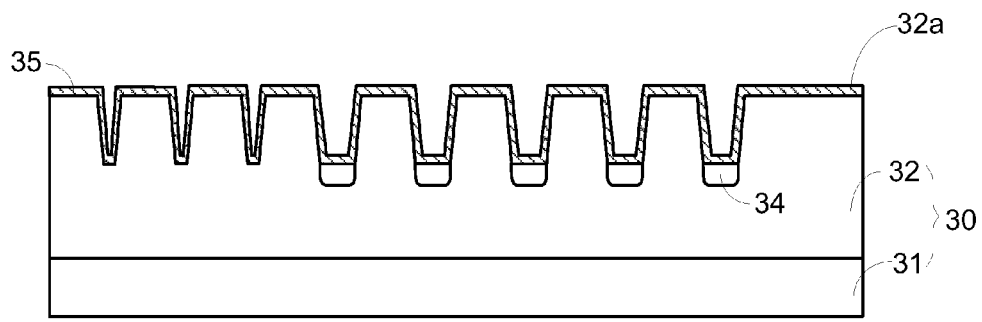
Figure 2M:
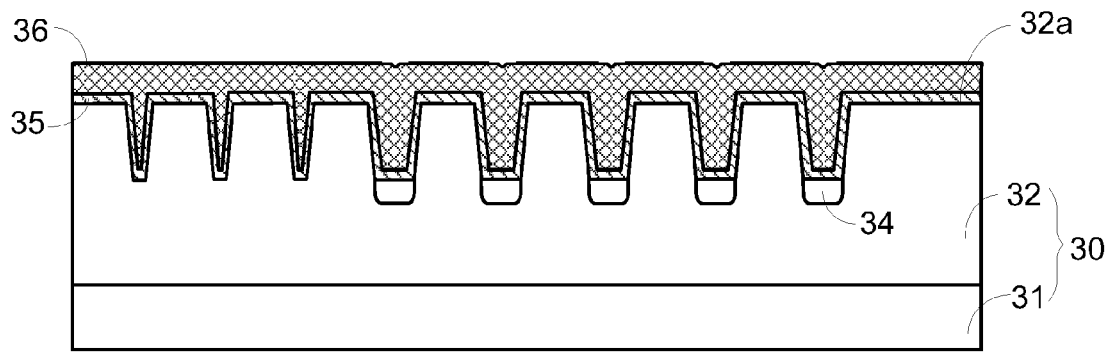
Figure 2N:
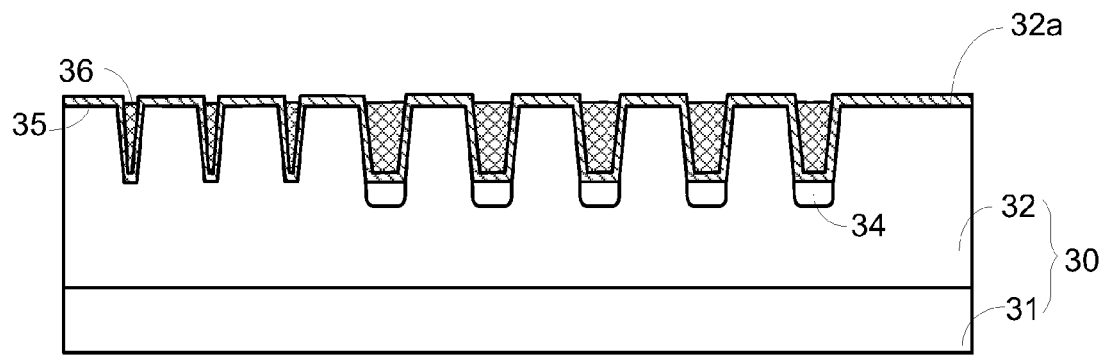
Figure 2O:
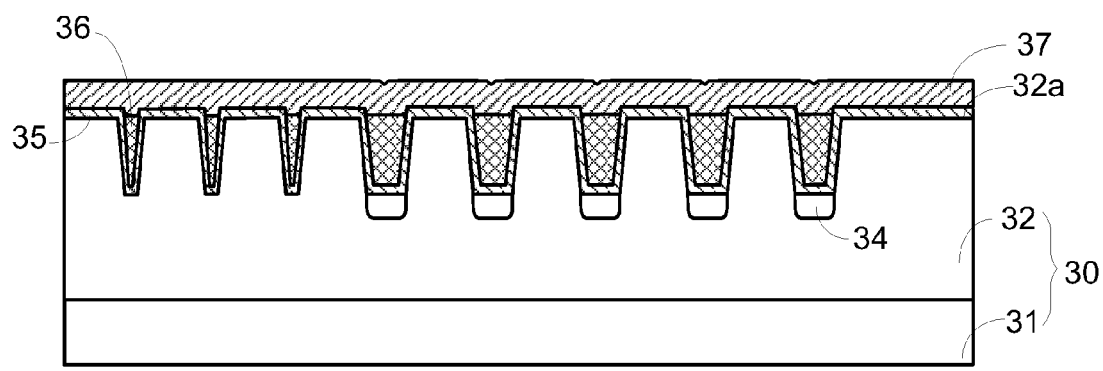
Figure 2P:
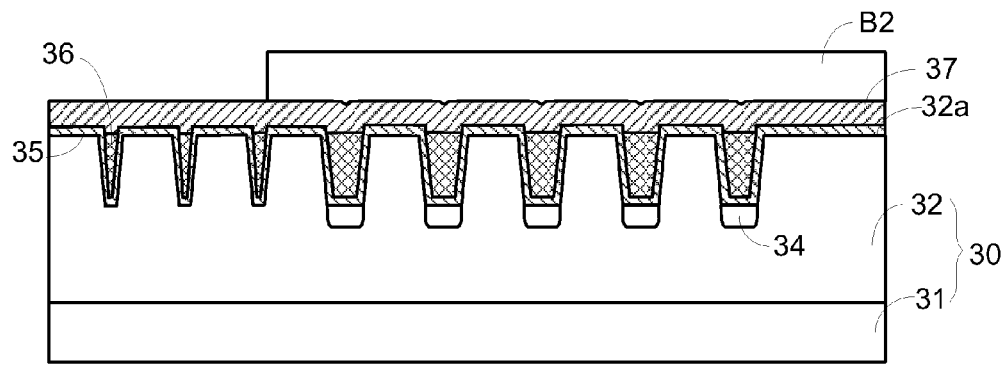
Figure 2Q:
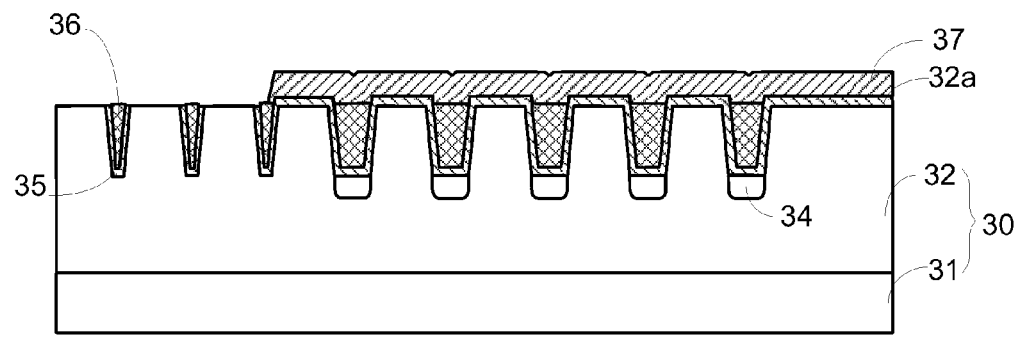
Figure 2R:
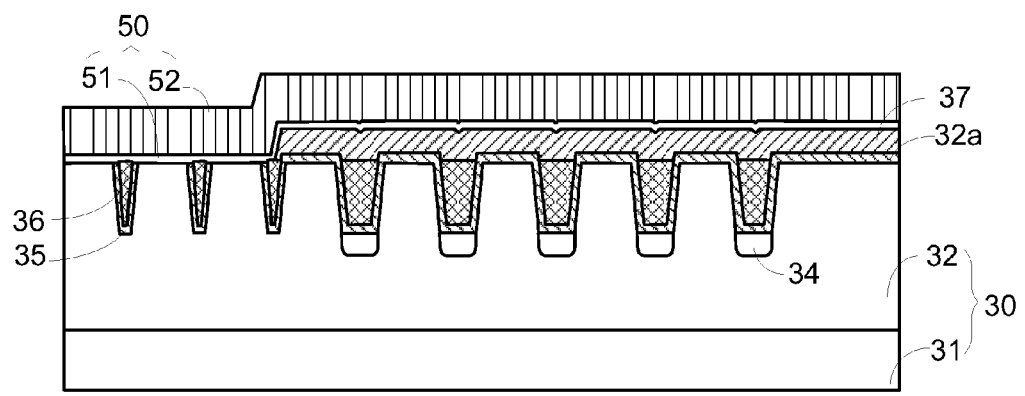
Figure 2S:
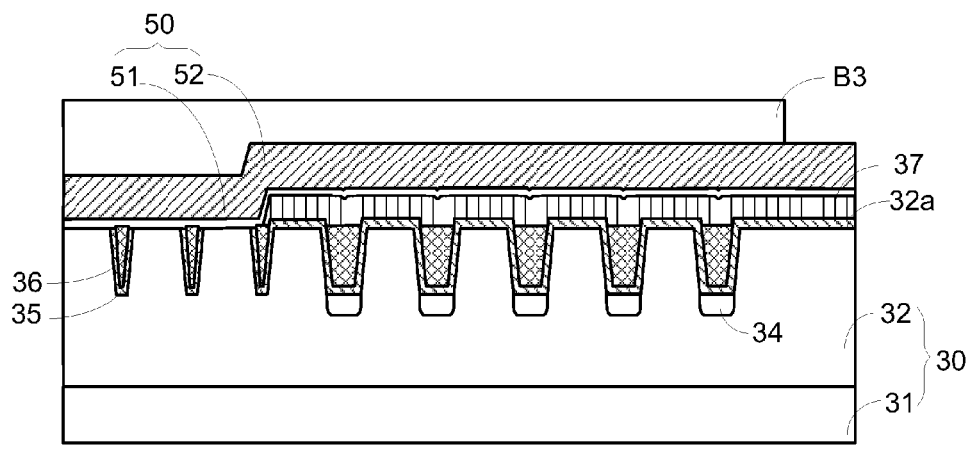
Figure 2T:
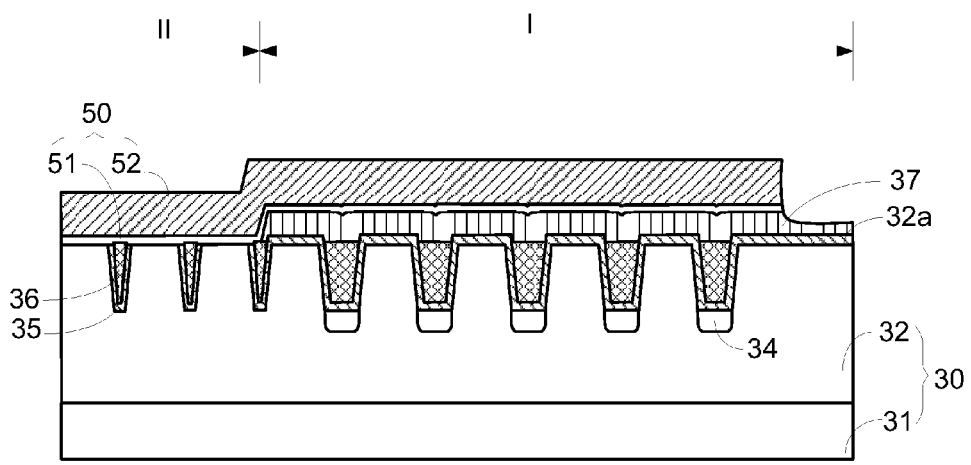

Please refer to FIGS. 2A~2T, which schematically illustrate a method of manufacturing a trench Schottky diode according to a first embodiment of the present invention.

Firstly, as shown in FIG. 2A, a semiconductor substrate 30 is provided. The semiconductor substrate 30 comprises a heavily-doped (N+ type) silicon layer 31 and a lightly-doped (N type) epitaxial layer 32. The lightly-doped epitaxial layer 32 is formed on the heavily-doped silicon layer 31. Moreover, the lightly-doped epitaxial layer 32 has a specified thickness for facilitating defining a plurality of trenches in the subsequent etching process.

Then, a thermal oxidation process at a temperature of 90~1000° C. or a chemical vapor deposition (CVD) process is carried out, and thus a first oxide layer 41 is formed on a surface 32a of the lightly-doped epitaxial layer 32. In this embodiment, the thickness of the first oxide layer 41 is about 6000 angstroms.

Then, as shown in FIG. 2B, a first photoresist layer B1 with a first photoresist pattern is formed on the first oxide layer 41. According to the first photoresist layer B1, the first oxide layer 41 is etched to have the first photoresist pattern. In this embodiment, the first photoresist pattern corresponds to the profiles of the trenches in the subsequent etching process. After the first oxide layer 41 is etched to have the first photoresist pattern, the first oxide layer 41 may be used as a hard mask for defining the trenches.

Then, as shown in FIG. 2C, the remaining first oxide layer 41 is served as a first mask layer. In an embodiment, the first oxide layer 41 is etched as the first mask layer by an etching process (e.g. a dry etching process). After the first mask layer is formed on the semiconductor substrate 30, the first photoresist layer B1 is removed, and the resulting structure is shown in FIG. 2D.

Then, as shown in FIG. 2E, by using the first oxide layer 41 as the first mask layer, a trench etching process is performed to form a plurality of trenches 33a and 33b in the semiconductor substrate 30. The opening width of the right-side trench 33a is about 2-3 times the opening width of the left-side trench 33b. The right-side trenches 33a are used as guard rings. The left-side trenches 33b are used as the trench Schottky diode. Generally, the guard rings are located at the peripheral regions of the semiconductor substrate 30. The inner region of the semiconductor substrate 30 is a device area, i.e. the trench Schottky diode.

After the trenches 33a and 33b are formed, rough edges may be formed on the bottom surfaces and the sidewalls of the trenches 33a and 33b. Then, a trench rounding process is performed to remove the rough edges so as to provide a better condition for the formation of associated oxide layers in the subsequent processes. In an embodiment, the trench rounding process is carried out by performing a dry etching process at a thickness of several hundred angstroms to modify the surfaces of the trenches 33a and 33b. Then, a second oxide layer 42 is formed on the surfaces (including the bottom surfaces and the sidewalls) of the trenches 33a and 33b. The second oxide layer 42 is served as a sacrificial oxide layer (see FIG. 2F).

Then, as shown in FIG. 2G, a chemical vapor deposition process is performed to form a third oxide layer 43. The narrow trenches 33b are filled with the third oxide layer 43.

Whereas, the third oxide layer 43 are formed on the bottom surfaces and the sidewalls of the wide trenches 33a. That is, the second oxide layer 42 within the trenches 33a and 33b and the first oxide layer 41 are covered by the third oxide layer 43.

Then, as shown in FIG. 2H, an etch-back process is performed to partially remove the third oxide layer 43. Consequently, the third oxide layer 43 on the bottom surfaces of the wide trenches 33a is thinned. Whereas, since the narrow trenches 33b are filled with the third oxide layer 43, the etch-back process fails to etch the bottom surface of the narrow trenches 33b.

Then, as shown in FIG. 2I, an ion implantation process and a drive-in process are performed to dope the epitaxial layer 32 with P-type dopant through the wide trenches 33a. Consequently, a plurality of P-type doped regions 34 are formed under the trenches 33a (see FIG. 2J).

Then, as shown in FIG. 2K, a wet etching process is performed with a hydrofluoric acid (HF) solution to remove the first oxide layer 41, the second oxide layer 42 and the third oxide layer 43.

Then, as shown in FIG. 2L, a thermal oxidation process is carried out at a temperature of 90~1000° C., and thus a gate oxide layer 35 is formed on the surfaces of the trenches 33a and 33b and the surface 32a of the semiconductor substrate 30.

Then, as shown in FIG. 2M, a polysilicon structure 36 is formed on the gate oxide layer 35 and filled in the trenches 33a and 33b by a chemical vapor deposition (CVD) process.

Then, as shown in FIG. 2N, an etch-back process is performed to remove the undesired part of the polysilicon structure 36. That is, a dry etching process is performed to uniformly and downwardly etch the polysilicon structure 36 for a preset etching time without the need of using any photoresist pattern. As shown in FIG. 2N, the gate oxide layer 35 is exposed, and the polysilicon structure 36 is still remained in the trenches 33a and 33b.

Then, as shown in FIG. 2O, a chemical vapor deposition (CVD) process is performed to form a fourth oxide layer 37 on the gate oxide layer 35 and the polysilicon structure 36.

After the fourth oxide layer 37 is formed, a second photoresist layer B2 with a second photoresist pattern is formed on the fourth oxide layer 37 (see FIG. 2P). Then, as shown in FIG. 2Q, the fourth oxide layer 37 and the gate oxide layer 35 uncovered by the second photoresist layer B2 are removed by a contact etching process. Then, the second photoresist layer B2 is removed. Meanwhile, the fourth oxide layer 37 is served as a second mask layer.

Then, as shown in FIG. 2R, a metal sputtering process is performed to form a metal sputtering layer 50 on the second mask layer, the surface 32a of the semiconductor substrate 30 and the polysilicon structure 36. In this embodiment, the metal sputtering layer 50 comprises a first metal layer 51 and a second metal layer 52. The first metal layer 51 is made of titanium (Ti). The second metal layer 52 is sputtered on the first metal layer 51. In addition, the second metal layer 52 is made of aluminum/silicon/copper (Al/Si/Cu) alloy.

After the first metal layer 51 of the metal sputtering layer 50 is in contact with the surface 32a of the lightly-doped (N type) epitaxial layer 32 of the semiconductor substrate 30, a Schottky contact is generated. Moreover, after this step is performed, a rapid thermal process (RTP) is optionally performed to facilitate formation of the Schottky contact.

Then, as shown in FIG. 2S, a third photoresist layer B3 with a third photoresist pattern is formed on the metal sputtering layer 50. Then, the metal sputtering layer 50 uncovered by the third photoresist layer B3 (i.e. the right-side area of the wafer as shown in FIG. 2R) is removed by an etching process. After the etching process is completed, the third photoresist layer B3 is removed. The resulting structure is shown in FIG. 2T. In this step, the etching process is a metal etching process to remove the first metal layer 51 and the second metal layer 52 of the metal sputtering layer 50 uncovered by the third photoresist layer B3. Consequently, the surface of the fourth oxide layer 37 (i.e. the second mask layer) at the right-side area of the wafer is exposed. In practice, due to the over-etching effect of the metal etching process, the exposed fourth oxide layer 37 is partially removed. That is, the thickness of the exposed fourth oxide layer 37 is slightly shrunk (see FIG. 2T).

The finished trench Schottky diode according to the first embodiment of the present invention is shown in FIG. 2T. The outer area I is the guard ring. The inner area II is the device area. The P-type doped region 34 of the guard ring is effective to reduce the leakage current of the trench Schottky diode and increase the reverse voltage thereof. The experiments demonstrate that the reverse voltage of the trench Schottky diode can reach 160V. In a case that the trench Schottky diode of the present invention has the size similar to the conventional trench Schottky diode, the leakage current can be reduced to 10 microamperes or less.

In the first embodiment of the present invention, the trench Schottky diode comprises a semiconductor substrate 30, a plurality of P-type doped regions 34, a gate oxide layer 35, a plurality of polysilicon structures 36, a second mask layer (i.e. the fourth oxide layer 37) and a metal sputtering layer 50. A plurality of trenches 33a and 33b are formed in the semiconductor substrate 30. These trenches are classified into two types, i.e. first trenches 33a and second trenches 33b. The opening width of the first trench 33a is greater than the opening width of the second trench 33b. The P-type doped regions 34 are formed in the semiconductor substrate 30 and located under the first trenches 33a. The gate oxide layer 35 is formed on the sidewalls and the bottom surfaces of the trenches 33a and 33b and formed on a part of a surface 32a of the semiconductor substrate 30. The polysilicon structures 36 are formed on the gate oxide layer 35 within the trenches 33a and 33b. The second mask layer 37 is formed on the polysilicon structures 36 within the first trenches 33a and the gate oxide layer 35. The metal sputtering layer 50 is formed on a part of the surface 32a of the semiconductor substrate 30, the polysilicon structures 36 within the second trenches 36 and a part of the mask layer 37.

Figure 3A:
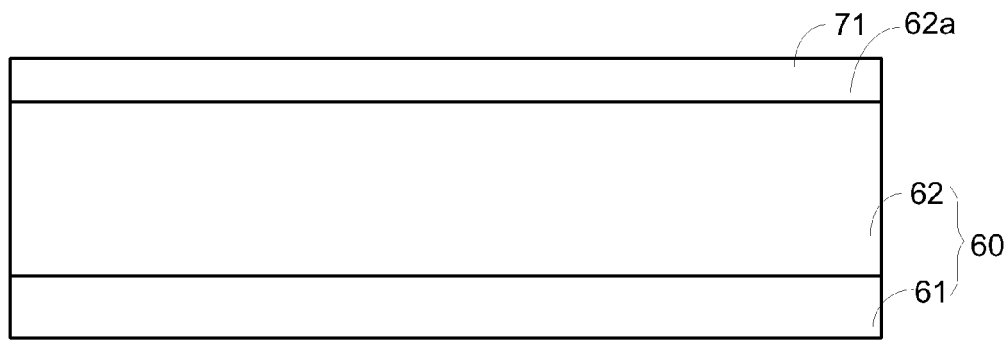
FIGS. 3A~3R schematically illustrate a method of manufacturing a trench Schottky diode according to a second embodiment of the present invention.
Figure 3B:
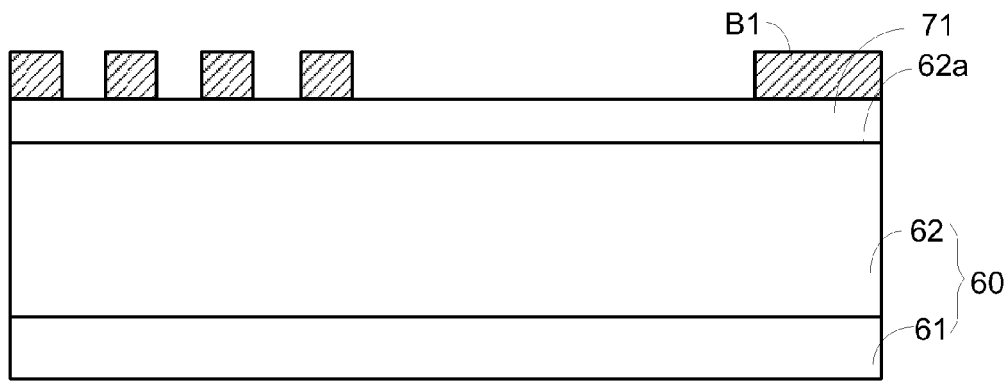
Figure 3C:
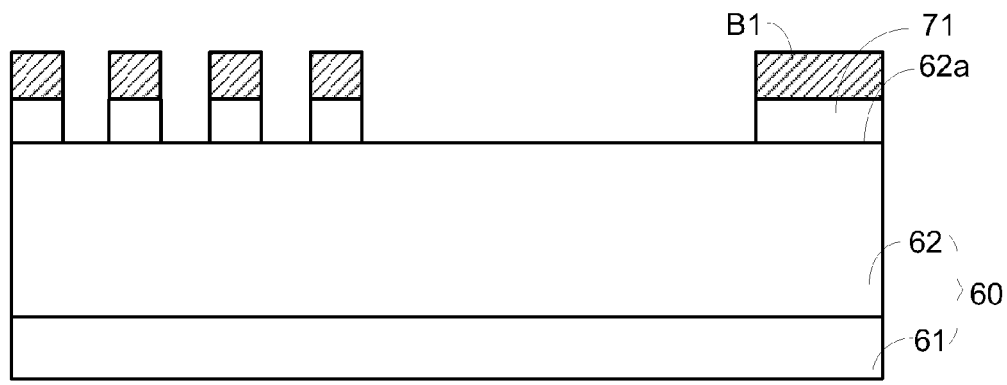
Figure 3D:
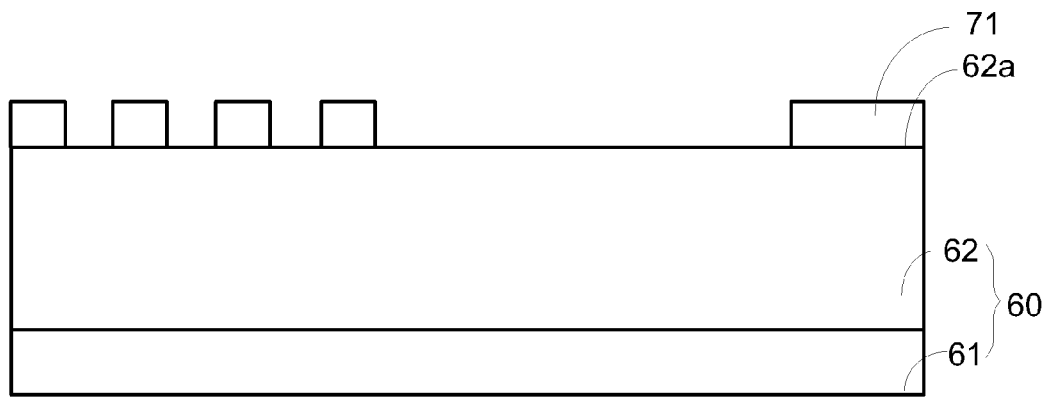
Figure 3E:
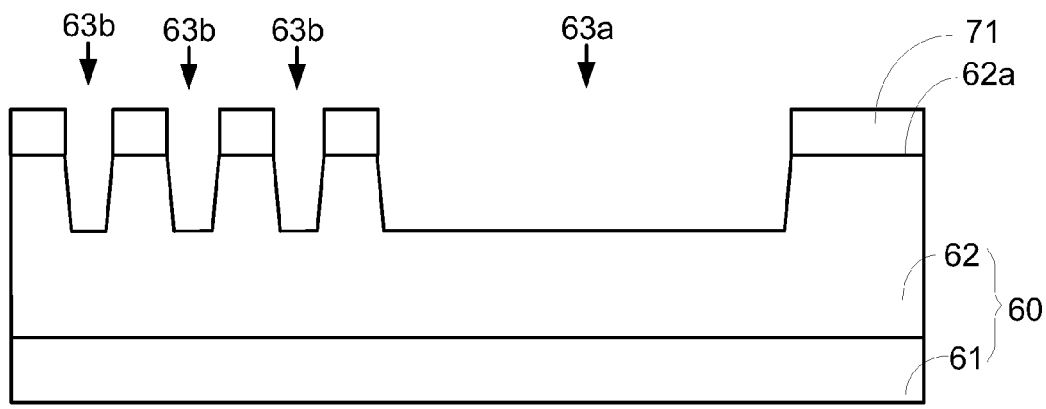
Figure 3F:
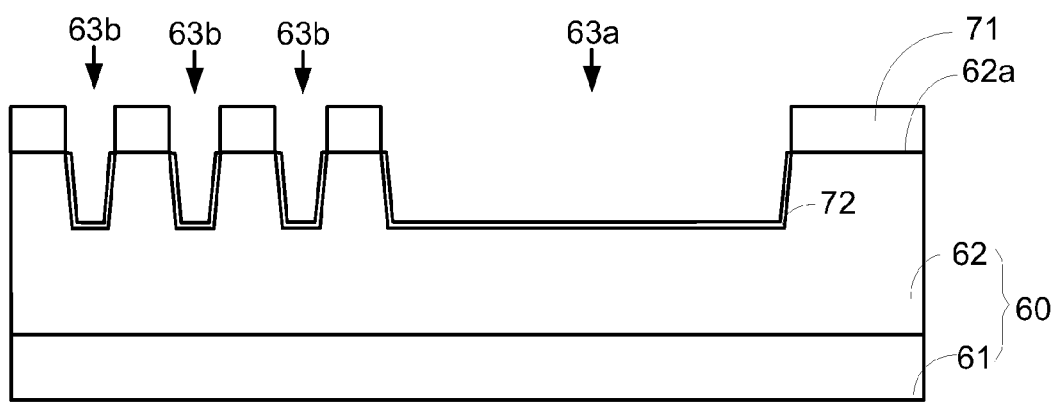
Figure 3G:
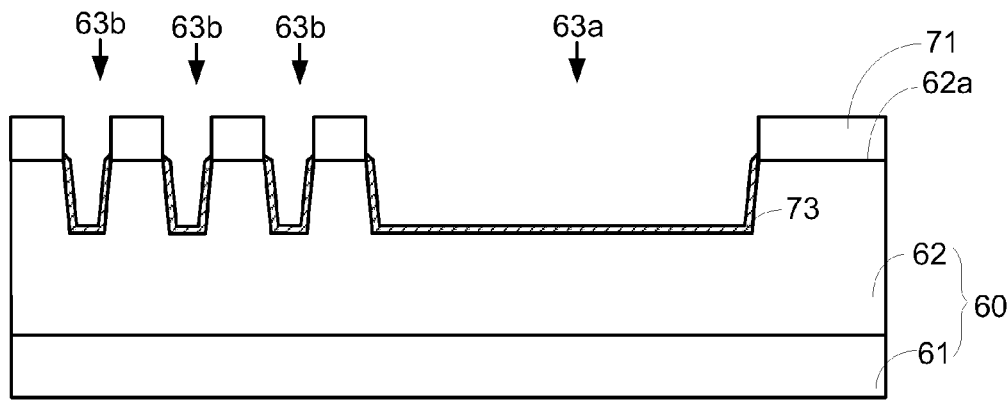
Figure 3H:
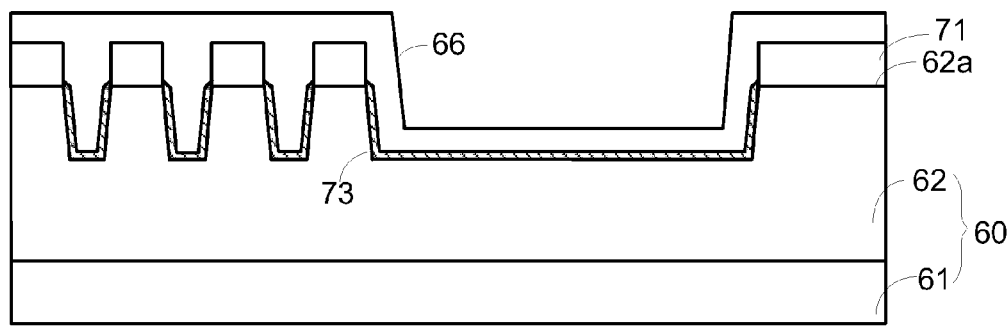
Figure 3I:
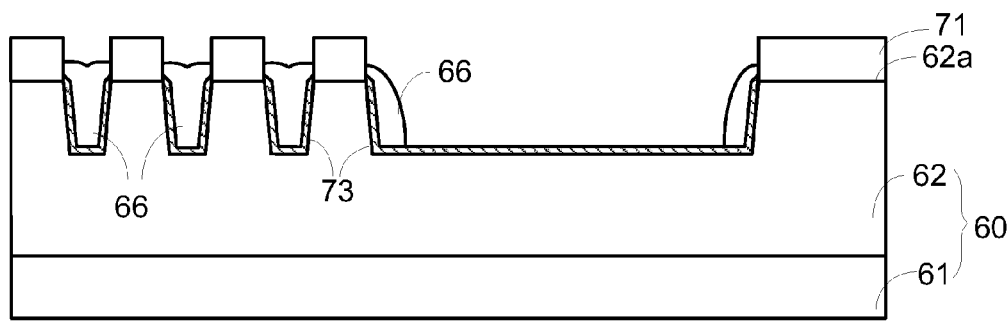
Figure 3J:
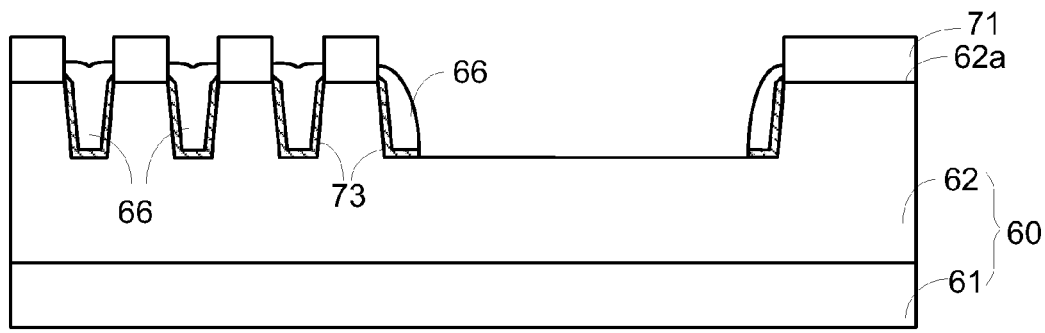
Figure 3K:
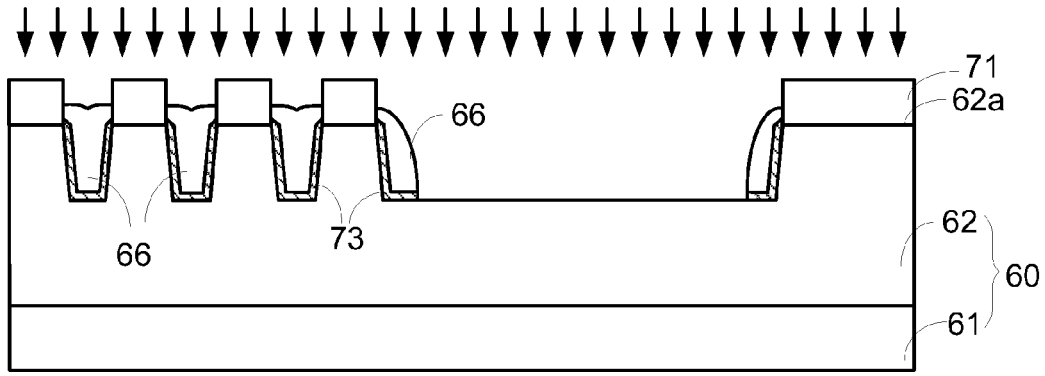
Figure 3L:
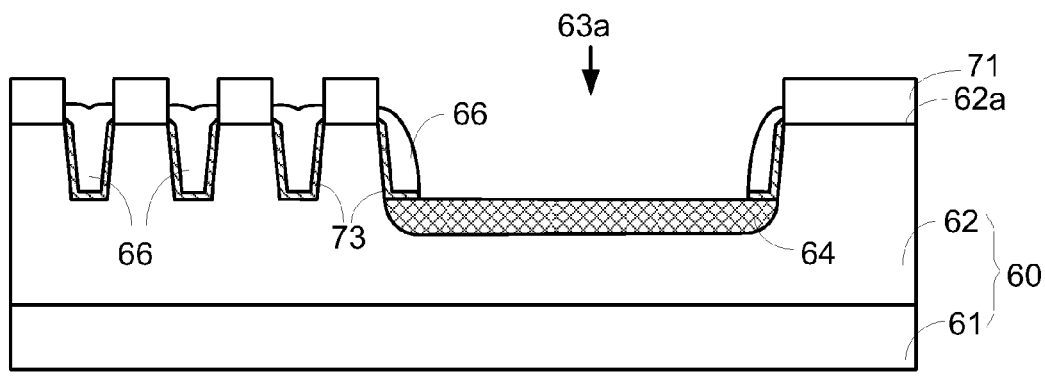
Figure 3M:
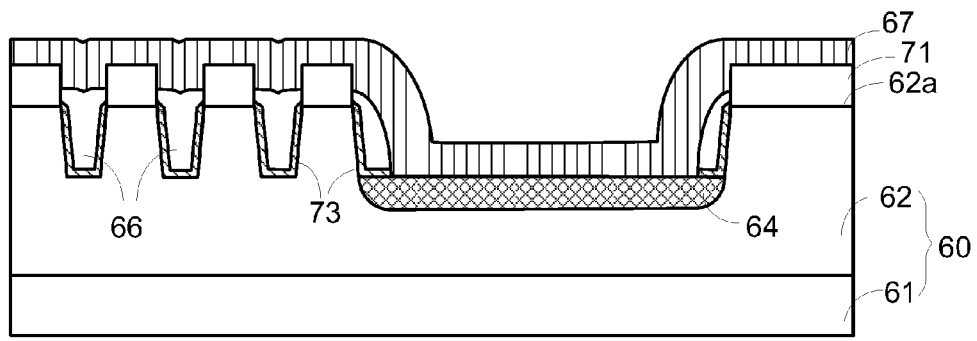
Figure 3N:
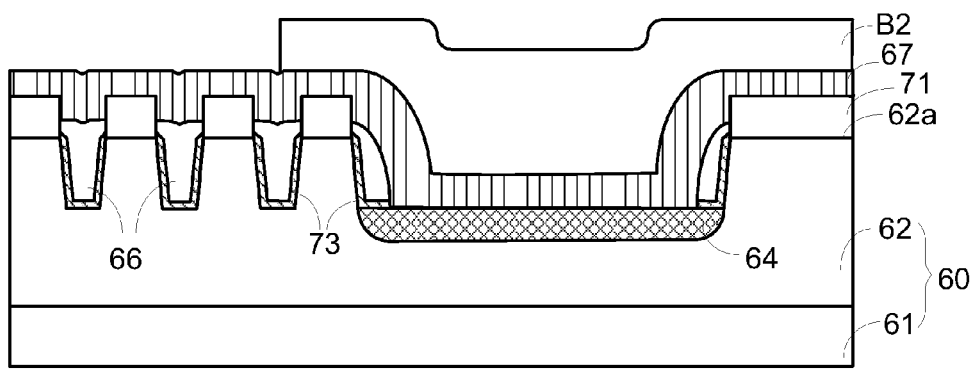
Figure 3O:
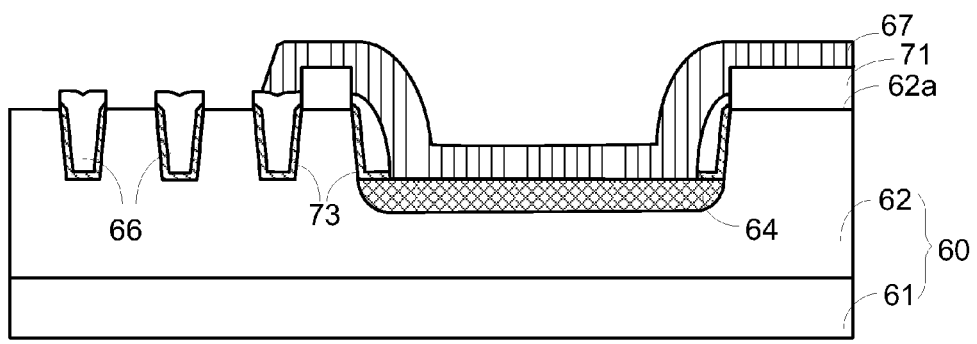
Figure 3P:
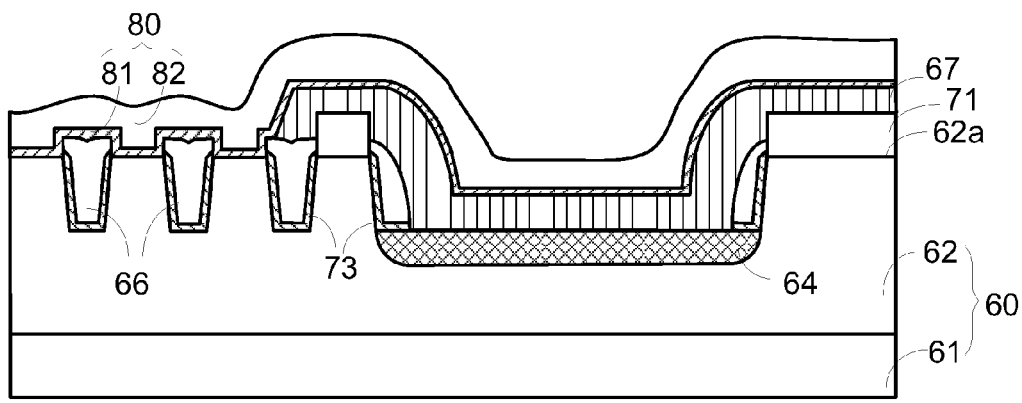
Figure 3Q:
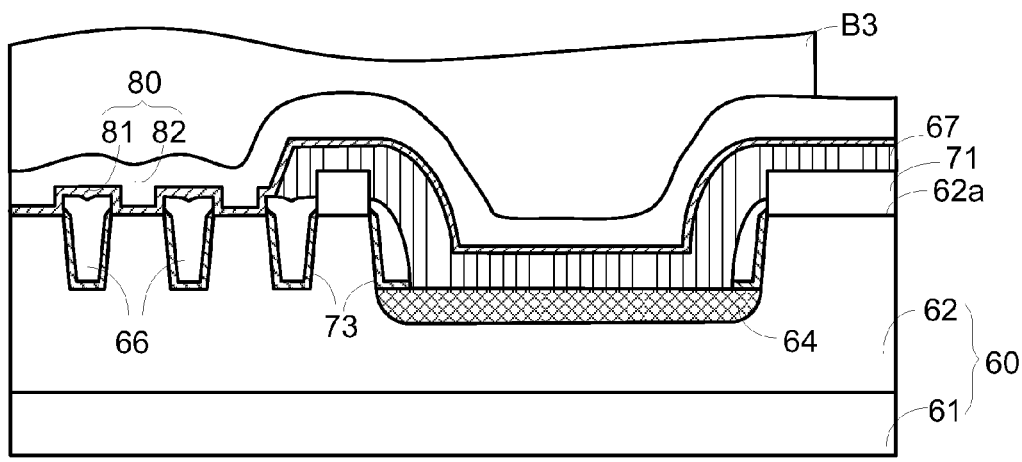
Figure 3R:
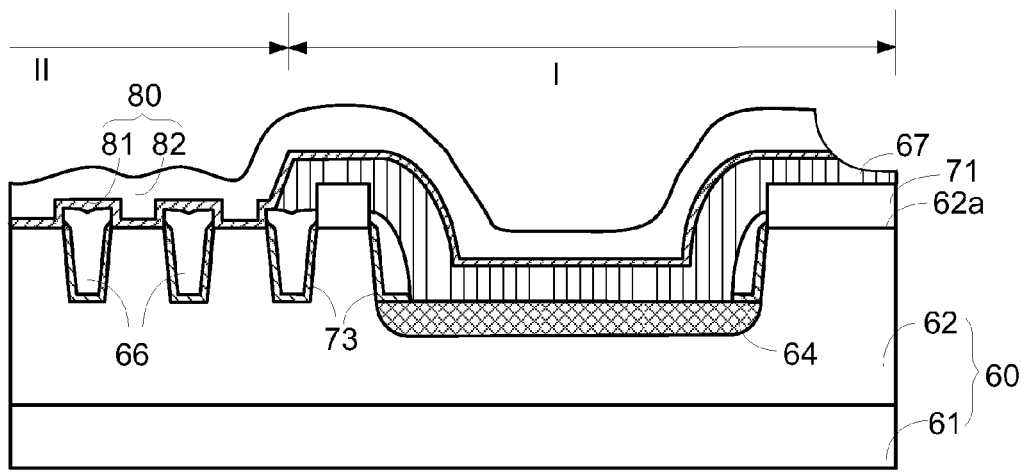

Please refer to FIGS. 3A~3R, which schematically illustrate a method of manufacturing a trench Schottky diode according to a second embodiment of the present invention.

Firstly, as shown in FIG. 3A, a semiconductor substrate 60 is provided. The semiconductor substrate 60 comprises a heavily-doped (N+ type) silicon layer 61 and a lightly-doped (N type) epitaxial layer 62. The lightly-doped epitaxial layer 62 is formed on the heavily-doped silicon layer 61. Moreover, the lightly-doped epitaxial layer 62 has a specified thickness for facilitating defining a plurality of trenches in the subsequent etching process.

Then, a thermal oxidation process at a temperature of 90~1000° C. or a chemical vapor deposition (CVD) process is carried out, and thus a first oxide layer 71 is formed on a surface 62a of the lightly-doped epitaxial layer 62. In this embodiment, the thickness of the first oxide layer 61 is about 6000 angstroms.

Then, as shown in FIG. 3B, a first photoresist layer B1 with a first photoresist pattern is formed on the first oxide layer 71. According to the first photoresist layer B1, the first oxide layer 71 is etched to have the first photoresist pattern. In this embodiment, the first photoresist pattern corresponds to the profiles of the trenches in the subsequent etching process.

After the first oxide layer 71 is etched to have the first photoresist pattern, the first oxide layer 71 may be used as a hard mask for defining the trenches.

Then, as shown in FIG. 3C, the remaining first oxide layer 71 is served as a first mask layer. In an embodiment, the first oxide layer 71 is etched as the first mask layer by an etching process (e.g. a dry etching process). After the first mask layer is formed on the semiconductor substrate 60, the first photoresist layer B1 is removed, and the resulting structure is shown in FIG. 3D.

Then, as shown in FIG. 3E, by using the first oxide layer 71 as the first mask layer, a trench etching process is performed to form a plurality of trenches 63a and 63b in the semiconductor substrate 60. The opening width of the right-side trench 63a is much wider than the opening width of the left-side trench 63b. The right-side trench 63a is used as a guard ring. The left-side trenches 63b are used as the trench Schottky diode.

After the trenches 63a and 63b are formed, rough edges may be formed on the bottom surfaces and the sidewalls of the trenches 63a and 63b. Then, a trench rounding process is performed to remove the rough edges so as to provide a better condition for the formation of associated oxide layers in the subsequent processes. In an embodiment, the trench rounding process is carried out by performing a dry etching process at a thickness of several hundred angstroms to modify the surfaces of the trenches 63a and 63b. Then, a second oxide layer 72 is formed on the surfaces (including the bottom surfaces and the sidewalls) of the trenches 63a and 63b. The second oxide layer 72 is served as a sacrificial oxide layer (see FIG. 3F).

Then, after a wet etching process is performed to remove the second oxide layer 72 and a part of the first oxide layer 71, a third oxide layer 73 is grown on the bottom surfaces and the sidewalls of the trenches 63a and 63b (see FIG. 3G).

Then, as shown in FIG. 3H, a polysilicon structure 66 is formed on the third oxide layer 73 and the first oxide layer 71 and filled in the left-side trenches 63b by a chemical vapor deposition (CVD) process Then, as shown in FIG. 3I, an etch-back process is performed to remove the undesired part of the polysilicon structure 66. That is, a dry etching process is performed to uniformly and downwardly etch the polysilicon structure 66 for a preset etching time without the need of using any photoresist pattern. As shown in FIG. 3I, the polysilicon structure 66 is still remained in the trenches 63a and 63b.

Then, as shown in FIG. 3J, an etch-back process is performed to partially remove the third oxide layer 73. Consequently, the third oxide layer 73 on the bottom surfaces of the wide trenches 63a is thinned or eliminated. Whereas, since the narrow trenches 63b are filled with the third oxide layer 73, the etch-back process fails to etch the bottom surface of the narrow trenches 63b.

Then, as shown in FIG. 3K, an ion implantation process and a drive-in process are performed to uniformly dope the epitaxial layer 62 with P-type dopant through the wide trench 63a at a preset implanting depth. Consequently, a P-type doped region 64 is formed under the trench 63a (see FIG. 3L).

Then, as shown in FIG. 3M, a chemical vapor deposition (CVD) process is performed to form a fourth oxide layer 67 to cover the first oxide layer 71, the third oxide layer 73 and the polysilicon structure 66.

After the fourth oxide layer 67 is formed, a second photoresist layer B2 with a second photoresist pattern is formed on the fourth oxide layer 67 (see FIG. 3N).

Then, as shown in FIG. 3O, the fourth oxide layer 67 and the first oxide layer 71 uncovered by the second photoresist layer B2 are removed by a contact etching process. Then, the second photoresist layer B2 is removed. Meanwhile, the fourth oxide layer 67 is served as a second mask layer.

Then, as shown in FIG. 3P, a metal sputtering process is performed to form a metal sputtering layer 80 on the second mask layer, the surface 62a of the semiconductor substrate 60 and the polysilicon structure 66. In this embodiment, the metal sputtering layer 80 comprises a first metal layer 81 and a second metal layer 82. The first metal layer 81 is made of titanium (Ti). The second metal layer 82 is sputtered on the first metal layer 81. In addition, the second metal layer 82 is made of aluminum/silicon/copper (Al/Si/Cu) alloy.

After the first metal layer 81 of the metal sputtering layer 80 is in contact with the surface 62a of the lightly-doped (N type) epitaxial layer 62 of the semiconductor substrate 60, a Schottky contact is generated. Moreover, after this step is performed, a rapid thermal process (RTP) is optionally performed to facilitate formation of the Schottky contact.

Then, as shown in FIG. 3Q, a third photoresist layer B3 with a third photoresist pattern is formed on the metal sputtering layer 80. Then, the metal sputtering layer 80 uncovered by the third photoresist layer B3 (i.e. the right-side area of the wafer as shown in FIG. 3Q) is removed by an etching process. After the etching process is completed, the third photoresist layer B3 is removed. The resulting structure is shown in FIG. 3R. In this step, the etching process is a metal etching process to remove the first metal layer 81 and the second metal layer 82 of the metal sputtering layer 80 uncovered by the third photoresist layer B3. Consequently, the surface of the fourth oxide layer 67 (i.e. the second mask layer) at the right-side area of the wafer is exposed. In practice, due to the over-etching effect of the metal etching process, the exposed fourth oxide layer 67 is partially removed. That is, the thickness of the exposed fourth oxide layer 67 is slightly shrunk (see FIG. 3R).

The finished trench Schottky diode according to the second embodiment of the present invention is shown in FIG. 3R. The outer area I is the guard ring. The inner area II is the device area. The P-type doped region 64 of the guard ring is effective to reduce the leakage current of the trench Schottky diode and increase the reverse voltage thereof. The experiments demonstrate that the reverse voltage of the trench Schottky diode can reach 160V. In a case that the trench Schottky diode of the present invention has the size similar to the conventional trench Schottky diode, the leakage current can be reduced to 10 microamperes or less.

In the second embodiment of the present invention, the trench Schottky diode comprises a semiconductor substrate 60, a plurality of P-type doped regions 64, an oxide layer (including a first oxide layer 71 and a second oxide layer 73 after various etching processes), a plurality of polysilicon structures 66, a second mask layer (i.e. the fourth oxide layer 67) and a metal sputtering layer 80. A plurality of trenches 63a and 63b are formed in the semiconductor substrate 60. These trenches are classified into two types, i.e. first trenches 63a and second trenches 63b. The opening width of the first trench 63a is wider than the opening width of the second trench 63b. The P-type doped regions 64 are formed in the semiconductor substrate 60 and located under the first trenches 63a. The oxide layer is formed on the sidewalls and the bottom surfaces of the trenches 63a and 63b and formed on a part of a surface 62a of the semiconductor substrate 60. The polysilicon structures 66 are formed on the oxide layer within the second trenches 63b and formed on the sidewalls of the first trenches 63a. The second mask layer 67 is formed on the polysilicon structures 66 within the first trenches 63a and the oxide layer. The metal sputtering layer 80 is formed on a part of the surface 62a of the semiconductor substrate 60, the polysilicon structures 66 within the second trenches 66 and a part of the mask layer 67.

From the above description, the trench Schottky diode manufactured according to the present invention comprises an outer area I (i.e. the guard ring) and an inner part II (i.e. the device area). Since the Schottky contact is located at the device area (or the inner part II), the guard ring (or the outer area I) is effective to isolate the Schottky contact from the external environment. In other words, the guard ring can minimize the possibility of causing the leakage current and increase the reverse voltage. Consequently, by the trench Schottky diode and the manufacturing method of the present invention, the problems encountered from the prior art will be obviated.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a trench Schottky diode, the method comprising steps of:
   providing a semiconductor substrate;
   forming a plurality of first trenches and a plurality of second trenches in the semiconductor substrate, wherein the opening width of the first trench is greater than the opening width of the second trench;
   forming a plurality of doped regions in the semiconductor substrate and under respective first trenches;
   forming a gate oxide layer on a surface of the semiconductor substrate and surfaces of the first trenches and the second trenches;
   forming a polysilicon structure on the gate oxide layer;
   etching the polysilicon structure, so that the gate oxide layer within the first trenches and the second trenches is covered by the polysilicon structure;
   forming a mask layer to cover the polysilicon structure within the first trenches and the gate oxide layer within the first trenches;
   etching the semiconductor substrate, so that the surface of the semiconductor substrate uncovered by the mask layer is exposed; and
   forming a metal sputtering layer to cover a part of the surface of the semiconductor substrate, the polysilicon structure within the second trenches and a part of the mask layer.

2. The method as claimed in claim 1, wherein the semiconductor substrate comprises a heavily-doped silicon layer and a lightly-doped epitaxial layer.

3. The method as claimed in claim 1, wherein the step of forming the first trenches and the second trenches comprises sub-steps of:
   performing a thermal oxidation process, thereby forming a first oxide layer on the surface of the semiconductor substrate;
   forming a first photoresist layer with a first photoresist pattern on the first oxide layer;
   etching the first oxide layer according to the first photoresist pattern, so that the first photoresist pattern is transferred to the first oxide layer; and
   etching the semiconductor substrate by using the first oxide layer as an etch mask, thereby forming the first trenches and the second trenches.

4. The method as claimed in claim 1, wherein the polysilicon structure is formed on the gate oxide layer by a chemical vapor deposition process.

5. The method as claimed in claim 1, wherein the step of forming the doped regions comprises sub-steps of:
   forming a second oxide layer within the first trenches and the second trenches;
   forming a third oxide layer on the first oxide layer and the second oxide layer, and filling the second trenches with the third oxide layer;
   etching the third oxide layer, so that the third oxide layer within the first trenches is thinned or eliminated;
   performing an ion implantation process and a drive-in process to form the doped regions under the first trenches, wherein the doped regions are P-type doped regions; and
   removing the first oxide layer, the second oxide layer and the third oxide layer.

6. The method as claimed in claim 1, wherein the step of forming the mask layer comprises sub-steps of:
   forming a fourth oxide layer as gate oxide and a polysilicon layer, comprising with a polysilicon etching back process to remove part of polysilicon for exposing the gate oxide layer;
   forming a fifth oxide to cover the gate oxide and polysilicon surface;
   forming a second photoresist layer with a second photoresist pattern on the fifth oxide layer;
   performing a contact etching process to partially remove the fifth oxide layer according to the second photoresist pattern, so that the mask layer is formed and a part of the semiconductor layer and the polysilicon structure within the second trenches are exposed; and
   removing the second photoresist layer.

7. The method as claimed in claim 1, wherein the step of forming the metal sputtering layer comprises sub-steps of:
   performing a metal sputtering process to form a first metal layer on the mask layer, a part of the semiconductor layer and the polysilicon structure within the second trenches; and
   performing another metal sputtering process to form a second metal layer on the first metal layer, wherein the first metal layer and the second metal layer are collectively defined as the metal sputtering layer.

8. The method as claimed in claim 7, wherein the first metal layer is made of titanium, and the second metal layer is made of aluminum/silicon/copper alloy.

9. The method as claimed in claim 1, further comprising steps of:
   forming a third photoresist layer with a third photoresist pattern on the metal sputtering layer;
   performing a metal etching process to partially remove the metal sputtering layer according to the third photoresist pattern, so that a part of the mask layer is exposed; and
   removing the third photoresist layer.

10. A trench Schottky diode, comprising:
    a semiconductor substrate with a plurality of first trenches and a plurality of second trenches, wherein the opening width of the first trench is wider than the opening width of the second trench;
    a plurality of doped regions formed in the semiconductor substrate and under respective first trenches;
    a gate oxide layer formed on sidewalls and bottom surfaces of the first trenches and the second trenches and formed on a part of a surface of the semiconductor substrate;

a plurality of polysilicon structures formed on the gate oxide layer within the first trenches and the second trenches;

a mask layer formed on the polysilicon structures within the first trenches and the gate oxide layer; and a metal sputtering layer covering a part of the surface of the semiconductor substrate, the polysilicon structures within the second trenches and a part of the mask layer.

11. The trench Schottky diode as claimed in claim 10, wherein the semiconductor substrate comprises a heavily-doped silicon layer and a lightly-doped epitaxial layer.

12. The trench Schottky diode as claimed in claim 10, wherein the doped regions are P-type doped regions.

13. The trench Schottky diode as claimed in claim 10, wherein the metal sputtering layer comprises a first metal layer and a second metal layer, wherein the first metal layer is made of titanium, and the second metal layer is made of aluminum/silicon/copper alloy.

14. A method for manufacturing a trench Schottky diode, the method comprising steps of:

providing a semiconductor substrate;

forming a first oxide layer on a surface of the semiconductor substrate;

etching the first oxide layer to form a first mask layer;

forming at least one first trench and a plurality of second trenches in the semiconductor substrate, wherein the opening width of the first trench is wider than the opening width of the second trench;

forming a second oxide layer on sidewalls and bottom surfaces of the first trench and the second trenches;

removing the second oxide layer;

forming a third oxide layer on the sidewalls and the bottom surfaces of the first trench and the second trenches;

forming a polysilicon structure to cover the third oxide layer and the first oxide layer;

etching the polysilicon structure, so that the third oxide layer within the second trenches and the sidewall of the first trench are covered by the polysilicon structure;

etching the third oxide layer, so that the third oxide layer within the first trench is thinned or eliminated;

performing an ion implantation process and a drive-in process to form a a doped region under the first trench;

forming a second mask layer to cover a part of the first oxide layer, a part of the polysilicon structure and the first trench;

etching the semiconductor substrate, so that the surface of the semiconductor substrate uncovered by the second mask layer is exposed; and forming a metal sputtering layer to cover a part of the surface of the semiconductor substrate, the polysilicon structure within the second trenches and a part of the second mask layer.

15. The method as claimed in claim 14, wherein the semiconductor substrate comprises a heavily-doped silicon layer and a lightly-doped epitaxial layer.

16. The method as claimed in claim 14, wherein the polysilicon structure is formed by a chemical vapor deposition process.

17. The method as claimed in claim 14, wherein the doped region is a P-type doped region.

18. The method as claimed in claim 14, wherein the step of forming the second mask layer comprises sub-steps of:

forming a fourth oxide layer on the polysilicon structure and the first oxide layer;

forming a photoresist layer with a photoresist pattern on the fourth oxide layer;

performing a contact etching process to partially remove the fourth oxide layer according to the photoresist pattern, so that the second mask layer is formed and a part of the semiconductor layer and the polysilicon structure within the second trenches are exposed; and removing the photoresist layer.

19. The method as claimed in claim 14, wherein the step of forming the metal sputtering layer comprises sub-steps of:

performing a metal sputtering process to form a first metal layer on the second mask layer, a part of the semiconductor layer and the polysilicon structure within the second trenches; and performing another metal sputtering process to form a second metal layer on the first metal layer, wherein the first metal layer and the second metal layer are collectively defined as the metal sputtering layer.

20. The method as claimed in claim 19, wherein the first metal layer is made of titanium, and the second metal layer is made of aluminum/silicon/copper alloy.

21. A trench Schottky diode, comprising:

a semiconductor substrate with at least one first trench and a plurality of second trenches, wherein the opening width of the first trench is wider than the opening width of the second trench;

a doped region formed in the semiconductor substrate and under the first trench;

an oxide layer formed on sidewalls and bottom surfaces of the second trenches, formed on a sidewall and a part of a bottom surface of the first trench, and formed on a part of a surface of the semiconductor substrate;

a plurality of polysilicon structures formed on the oxide layer within the second trenches and formed on the oxide layer within the first trench;

a mask layer formed on the polysilicon structures within the first trench and a part of the oxide layer; and a metal sputtering layer covering a part of the surface of the semiconductor substrate, the polysilicon structures within the second trenches and a part of the mask layer.

22. The trench Schottky diode as claimed in claim 21, wherein the semiconductor substrate comprises a heavily-doped silicon layer and a lightly-doped epitaxial layer.

23. The trench Schottky diode as claimed in claim 21, wherein the doped regions are P-type doped regions.

24. The trench Schottky diode as claimed in claim 21, wherein the metal sputtering layer comprises a first metal layer and a second metal layer, wherein the first metal layer is made of titanium, and the second metal layer is made of aluminum/silicon/copper alloy.

* * * * *